US009647678B2

(12) United States Patent
Passamani et al.

(10) Patent No.: US 9,647,678 B2
(45) Date of Patent: May 9, 2017

(54) METHOD FOR OPERATING RADIO FREQUENCY DIGITAL TO ANALOG CONVERSION CIRCUITRY IN THE EVENT OF A FIRST AND A SUBSEQUENT SECOND INPUT SAMPLE WITH DIFFERENT SIGNS AND AN DIGITAL TO ANALOG CONVERSION CIRCUITRY

(71) Applicant: Intel IP Corporation, Santa Clara, CA (US)

(72) Inventors: Antonio Passamani, Mori (AT); Franz Kuttner, St. Ulrich (AT); Michael Fulde, Weil (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/240,462

(22) Filed: Aug. 18, 2016

(65) Prior Publication Data
US 2017/0093422 A1 Mar. 30, 2017

(30) Foreign Application Priority Data
Sep. 25, 2015 (DE) .......................... 10 2015 116 241

(51) Int. Cl.
*H03M 1/66* (2006.01)
*H04L 27/00* (2006.01)
*H03M 1/74* (2006.01)

(52) U.S. Cl.
CPC .............. *H03M 1/66* (2013.01); *H03M 1/74* (2013.01); *H04L 27/00* (2013.01)

(58) Field of Classification Search
None
See application file for complete search history.

(56) References Cited

U.S. PATENT DOCUMENTS

| 8,907,830 | B2 * | 12/2014 | Bruennert | ............. | H03M 1/685 |
| | | | | | 341/145 |
| 9,059,661 | B2 * | 6/2015 | Moreira | .................... | H03C 5/00 |
| 9,184,974 | B1 * | 11/2015 | Baringer | ............... | H04L 27/206 |
| 9,379,883 | B1 * | 6/2016 | Kuttner | ................. | H04L 7/0083 |
| 2014/0146913 | A1 * | 5/2014 | Kuttner | ................... | H03M 1/66 |
| | | | | | 375/295 |
| 2016/0094235 | A1 * | 3/2016 | Kuttner | ................. | H03M 1/662 |
| | | | | | 341/144 |

* cited by examiner

*Primary Examiner* — Howard Williams
(74) *Attorney, Agent, or Firm* — Schwegman Lundberg & Woessner, P.A.

(57) ABSTRACT

A method for operating a radio frequency digital to analog conversion circuitry with a number of cells if a first input sample and a subsequent second input sample have different signs, comprises generating a first analog signal corresponding to the first input sample using a first subset of the number of cells of the digital to analog conversion circuitry with a local oscillator signal having a first polarity. The method further comprises applying a second local oscillator signal with an inverted polarity to a second subset of cells of the digital to analog conversion circuitry when a number of cells from the first subset of cells are used and selecting a number of cells from the second subset of cells to generate a second analog signal corresponding to the second input sample.

19 Claims, 11 Drawing Sheets

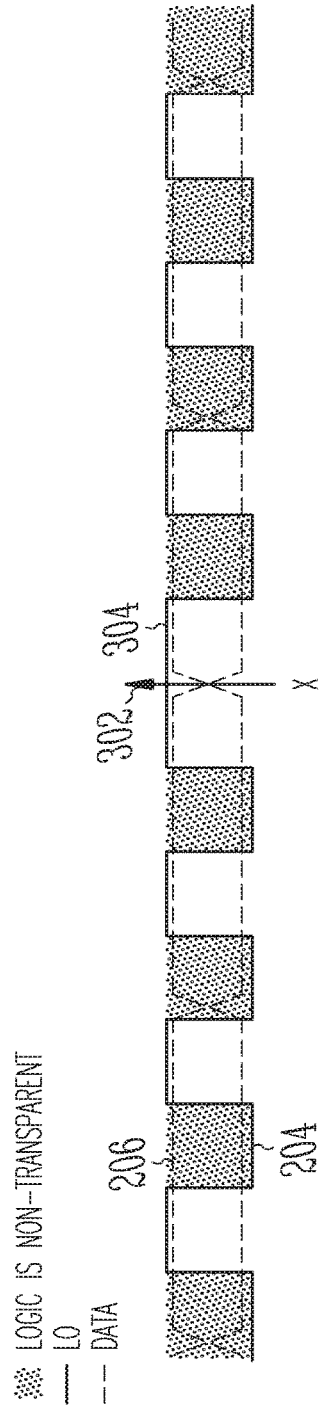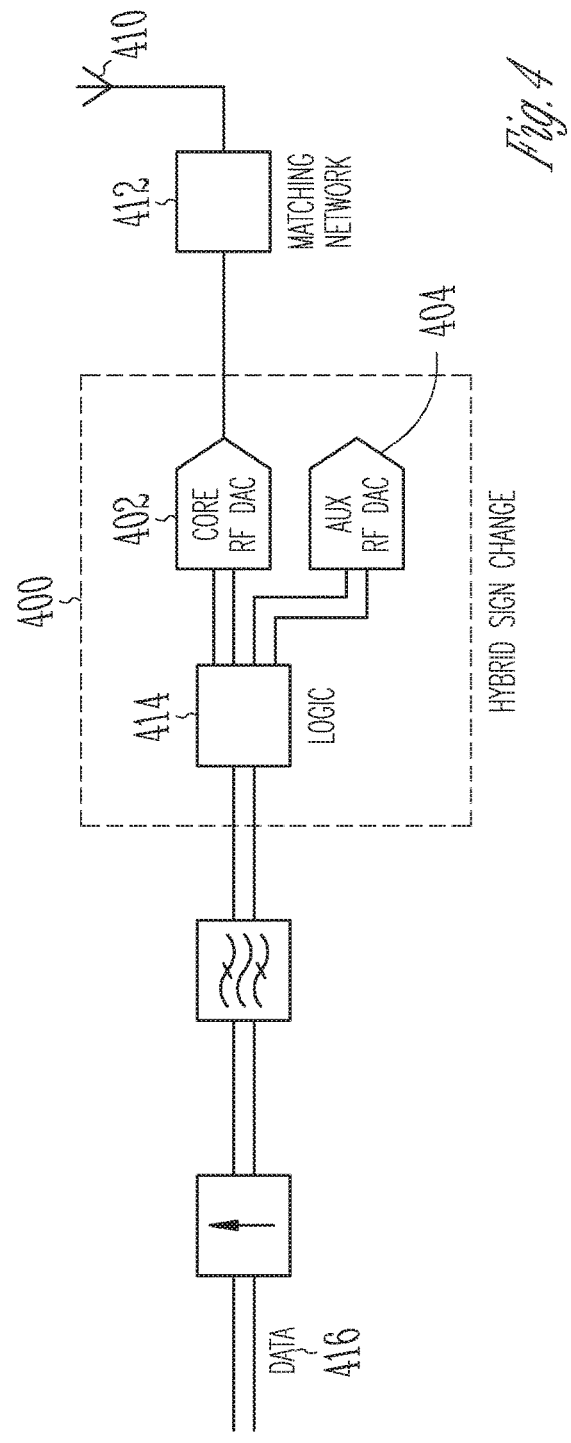

US 9,647,678 B2

METHOD FOR OPERATING RADIO FREQUENCY DIGITAL TO ANALOG CONVERSION CIRCUITRY IN THE EVENT OF A FIRST AND A SUBSEQUENT SECOND INPUT SAMPLE WITH DIFFERENT SIGNS AND AN DIGITAL TO ANALOG CONVERSION CIRCUITRY

This application claims the benefit of priority to German Patent Application No. 10 2015 116 241.5, filed Sep. 25, 2015, which is incorporated herein by reference in its entirety.

FIELD

Examples relate to a method for operating a radio frequency digital to analog conversion circuitry in the event of a first and a subsequent second input sample with different signs and to associated digital to analog conversion circuitry.

BACKGROUND

Digital to analog conversion circuitry is widely used, for example to implement one or more digital to analog converters (DACs) for Wi-Fi, OFDM and similar transmitters, which may be used in mobile telecommunication applications. For example, in an I/Q transmitter, one DAC (I-DAC) generates the analog in-phase (I) component of the signal and one DAC (Q-DAC) generates the analog quadrature (Q) component of the signal. The trajectory of the signal to be transmitted (e.g. of a Wi-Fi signal) can be visualized in an I/Q diagram showing a continuous line representing the evolution of the transmitted signal in time which is generated using the two DACs. The signal trajectory of a complex signal crosses one of the axes repeatedly, each time causing one of the DACs to provide an analog signal with alternating sign. In particular, every time the trajectory crosses the x-axis (I) or the y-axis (Q), a zero crossing or sign change occurs in the I-DAC or in the Q-DAC, respectively. Consequently, a lot of sign changing events take place within the DACs during the transmission of a Wi-Fi, OFDM or similar signal.

Some DACs used to generate the I- and Q-components of the signal (RF DACs) comprise an array of cells, which can be connected either to a local oscillator signal (LO) or to ground. The energy of the signal generated by an individual DAC depends on the number of cells which are simultaneously providing the LO signal. In a synchronous implementation of the RF DAC, data (i.e. the signal selecting a cell to provide the LO signal) changes only when the cell is not transparent for the LO signal (depending on the particular implementation, this may be the case when the LO signal is low). That is, a change of data has no effect until the cell becomes transparent for the LO again (for example, high). It is beneficial to change the data when the LO is non-transparent because this automatically makes sure that an undesirable yet sometimes unavoidable delay or mismatch between LO and data is absorbed by the time it takes by the LO to cause transparency of the cell again.

In a dynamically signed RF DAC, the sign change is achieved by inverting the LO signal, and data and LO have to be kept synchronous and aligned also when the LO changes sign to become an inverted LO. The inverted LO has a 180° phase shift with respect to the previous LO. When the sign is changed, data has to be phase shifted by 180° as well in order to preserve the desired mutual timing. Even if this is achieved, however, the cell is transparent for the LO signal during the whole sign-changing transition, and there is no non-transparent timeslot to change data during the sign-changing transition itself. Consequently, during a sign changing event, a mismatch between data and the LO signal can principally not be compensated by performing a change of data during a non transparent period of the LO signal in conventional approaches. Therefore, the spectrum of the generated signal is deteriorated during the sign change. Consequently, there is room to enhance a method for operating radio frequency digital to analog conversion circuitry in the event of a first and a subsequent second input sample with different signs.

BRIEF DESCRIPTION OF THE FIGURES

Some embodiments of apparatuses and/or methods will be described in the following by way of example only, and with reference to the accompanying figures, in which

FIG. 3 illustrates signal creation using the cell of FIG. 2;

FIG. 4 illustrates an example of digital to analog conversion circuitry using two DACs of differing size;

DETAILED DESCRIPTION

Figure 1:
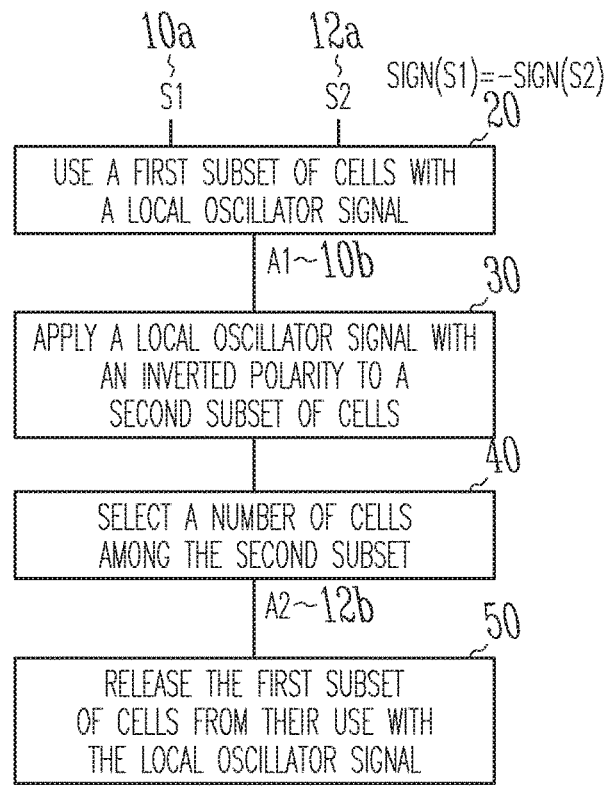
FIG. 1 shows a flowchart of an example of a method for operating radio frequency digital to analog conversion circuitry with a given number of cells in the event of a first input sample and a subsequent second input sample with different signs.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent,", to name just a few examples.

The terminology used herein is for the purpose of describing particular examples is not intended to be limiting for further examples. Whenever a singular form such as "a," "an" and "the" is used and using only a single element is neither explicitly or implicitly defined as being mandatory, further examples may also plural elements to implement the same functionality. Likewise, when a functionality is subsequently described as being implemented using multiple elements, further examples may implement the same functionality using a single element or processing entity. It will be further understood that the terms "comprises," "comprising." "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong, unless expressly defined otherwise herein.

Various examples may relate to or may be implemented within devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA). Frequency Division Multiple Access (FDMA). Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In some examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology.

A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 schematically illustrates a flow chart of an example of a method for operating a radio frequency digital to analog conversion circuitry with a given number of cells in the event of a first input sample 10 and a subsequent second input sample 12 with different signs, which comprises using 20 a first subset of the number of cells of the digital to analog conversion circuitry with a local oscillator signal having a first polarity to generate a first analog signal corresponding to the first input sample. The method further comprises applying 30 a second local oscillator signal with an inverted polarity to a second subset of cells of the digital to analog conversion circuitry such that it is applied while a number of cells among the first subset are used to generate the first analog signal. Further, the method comprises selecting 40 a number of cells among the second subset of cells to generate a second analog signal corresponding to the second input sample. The method further comprises releasing 50 the first subset of the number of cells from their use with the local oscillator signal, so that the second subset of cells can extend up the whole number of cells of the digital to analog conversion circuitry if needed for a further input sample.

By applying the inverted LO signal to the second subset of cells while other cells of the radio frequency digital to analog conversion circuitry use the LO signal allows to select the number of cells among the second subset early enough and within a time slot where the cells are not yet transparent for the inverted LO signal. Therefore, the time instant when the inverted LO signal is used to generate the second analog signal is only determined by the inverted LO signal itself and an eventual mismatch between data and the inverted LO is automatically compensated also in the event of a sign change. This, in turn, may provide for an output signal of the digital to analog conversion circuitry having reduced disturbances caused by sign changing events and, hence, having a cleaner spectrum. Consequently, in some examples, the second subset of cells is selected within a cycle of the second local oscillator signal which is non-transparent to selection with respect to the second local oscillator signal.

Releasing 50 the first subset of the number of cells from their use with the local oscillator signal after they were used to generate the first analog signal frees the cells so that they may be used with the second local oscillator signal if required to for a subsequent further input sample. Having the capability to use the cells for both local oscillator signals allows to implement a clean sign change without having to increase the number of cells of a DAC.

Further, in some examples, the second local oscillator signal is applied within a cycle of the first oscillator signal. Applying the second oscillator signal to the second subset of cells for the first time when the first local oscillator signal is already applied to other cells of the digital to analog circuitry within the first subset allows for the automatic compensation of possible mismatches between data and the second local oscillator signal, at the same time allowing to reuse cells of the digital to analog conversion circuitry which may previously have been used with the first oscillator signal. This, in turn, may allow to selectably use the given number of cells of a digital to analog conversion circuitry for either the first or the second subset. While the amplitudes of the signal are naturally small when a transition from one sign to another (a zero crossing) occurs, a first fraction of the given number of cells (within the first subset) can be used with the LO signal for the last sample before the zero crossing and a second fraction of the cells (the selected number of cells among the second subset) can be used with the inverted LO signal for the first sample after the zero crossing. At the same time, for the higher amplitudes or output powers, all cells of the given number of cells is available for input samples of a given sign so that according to the example, no increase of the number of cells is required since the dynamic range of the digital to analog circuit is maintained. Nonetheless, errors caused by sign changes in previous implementations can be reduced or avoided.

In further examples, the number of cells of the second subset of cells is selected from a set of reserved cells of the number of cells, the reserved cells being configured to use the second oscillator signal. In reserving a set of cells for the second oscillator signal, the layout of the reserved cells may be simplified since they do not need to be selectively connectable to the first oscillator signal or to the second oscillator signal. Likewise, a further set of reserved cells for the first oscillator signal exists in further examples in order to provide for the possibility of having sign changes in both directions. In some examples, the set of reserved cells is a fraction of the number of cells of the digital to analog conversion circuitry which is smaller than 25%, balancing the benefits of the clean sign change versus the small increase of the overall number of cells due to the additional reserved cells at a maintained dynamic range.

In further examples, the number of cells of the digital to analog conversion circuitry is arranged in an array of columns and rows, wherein the second subset of cells comprises cells of the last column of the array, if the first subset comprises cells of the first column and vice versa. Allocating the cells for the different subsets starting from opposite sides of an array of cells may allow for a particularly efficient implementation of the control circuitry used to apply the LO signal and the inverted LO signal to the corresponding subsets and to select the cells within subsets. With this respect, it is worth noting that in some examples, the selected number of cells among the cells of the second subset may be equal to the total number of cells within the subset while according to further examples, it may be less. Further it is noted that in some examples, the given number of cells within the digital to analog conversion circuitry may be controlled by a single controller (comprising, for example a column controller and a row controller), while in further examples, two or more controllers may be used for the total or given number of cells of the digital to analog conversion circuitry. The digital to analog conversion circuitry may so be viewed as a single digital to analog Converter or as a set of cooperating digital to analog Converters.

In some examples, applying the second local oscillator signal comprises switching an input of the cells of the second subset from ground to the second oscillator signal so that the cells may be selectively used as cells of the first subset or as cells of the second subset. In some examples, therefore, the second local oscillator signal can be applied to the second subset of cells while the local oscillator signal is already applied to cells of the digital to analog conversion circuitry. In further examples, a third subset of cells may therefore be connected to ground while the first and second subsets are used during a sign change.

Some examples, are given by a radio frequency digital to analog conversion circuitry having a given number of cells, which comprises a first subset of cells configured to use a first local oscillator signal and a second subset of cells configured to use a second local oscillator signal, while a third subset of cells is configured to selectively use the first local oscillator signal or the second local oscillator signal. In an efficient manner, the digital to analog conversion circuitry so comprises a first subset of cells and a second subset of cells used for a clean sign change while the third subset is selectively used for both signs of the input samples in order to provide a high dynamic range of the digital to analog conversion circuitry. To this end, the cells of the third subset of cells comprise an input configured to be switched from ground to the second or from ground to the first oscillator signal in some examples. According to some examples, the number of cells in the first subset and the number of cells in the second subset is equal.

In order to provide a high dynamic range of the digital to analog conversion circuitry, the number of cells in the third subset is bigger than the number of cells in first subset and in the second subset in some examples.

In some examples, the first local oscillator signal and the second local oscillator signal have the same frequency and a phase shift of 180 degrees to provide for the possibility of a sig change.

Figure 2:
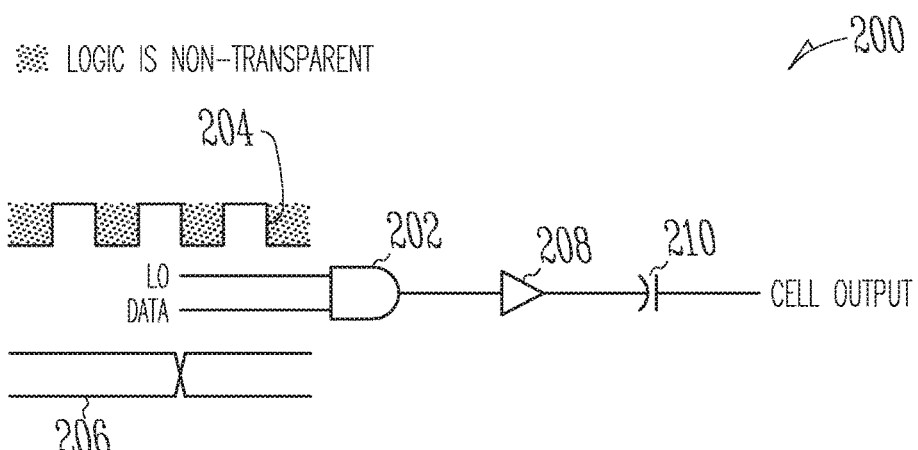
FIG. 2 illustrates an example of a single cell of a digital to analog conversion circuit.

In FIG. 2, a possible implementation of a cell of a digital to analog conversion circuitry is shown, while FIG. 3 illustrates an exemplary course of signals that can be created using the cell of FIG. 2.

Generally, digital to analog conversion circuitry (e.g. a RF-DAC) may be made by an array of cells, which can be connected either to LO or to ground. In a synchronous implementation of an RF-DAC, data changes only when the LO is non-transparent (for example, low), so that no effect is produced on the output until the LO goes transparent (for example, high) again. When the LO is transparent, the cell provides the LO signal at an output of the cell. Which of the two digital oscillation levels of an LO signal is transparent in this sense depends on the particular implementation of the cell. Likewise, the non-transparency can be on the low or high side of the LO signal depending on the logic port used for gating the LO signal with the data. An AND gating is non-transparent on the low side of the signal, because 0 & {0,1}=0. In the example illustrated in FIG. 2, AND gating is chosen so that the cell 200) comprises an AND gate 202 having a first input connected to the LO signal 204 and a second input connected to the data 206 The data signal 206 needs to be high if the cell is selected to be used. The output of the AND gate 202 is coupled, via a diode 208 and a capacitance 210 to an output 212 of the cell so that the LO signal provided at the output of the AND gate 202 and so at the output 212 of the cell can superimpose with the signals of other cells. For the cell 200 to be transparent for the LO Signal 204 (i.e. the LO signal 204 is provided at the output 212), the data signal 206 needs to be high.

However, when the data signal 206 would change from low to high or vice versa if the LO signal is high, the output of the cell would provide a high period that is shortened as compared to the LO signal and having signal edges at different positions. This may be caused by a delay between the data signal and 206 and the LO signal 204 and is undesirable since it would deteriorate the spectrum of the signal. In order to avoid this, it is desirable to change the state of the data signal 206 within the low period of the LO signal 204. e.g. triggered by the falling edge of the LO signal 204 as illustrated in FIG. 2.

In a dynamically signed RF-DAC, the sign change is achieved by inverting the LO signal 204, as illustrated at the sign change position 302 in FIG. 3, showing the LO signal 204 as well as the data signal 206 and there evolution over time in the event of a sign change. The data signal 206 and LO signal 204 have to be kept synchronous and aligned when the LO signal 204 is inverted to become the inverted LO signal 304 (which is equivalent to using a second oscillator signal having an inverted polarity). The inverted LO signal 304 has a 180° phase shift with respect to the direct LO signal 204, hence when the sign is changed at the sign change position 302, the data signal 206 has to be phase shifted by 180° as well. The principal problem of the sign change in conventional approaches is shown in FIG. 3. Around the sign change position, which is the time instant between two subsequent input samples having different sign, the LO Signal 204 and the inverted LO signal 304 at an input of the cell is high during the whole sign-changing transition, so there is no non-transparent time slot where to change the data signal during the sign-changing transition itself. For this reason it is principally not possible to have a clean transition in the event of a sign change within conventional approaches. This may be overcome by using an example of a method for operating radio frequency digital to analog conversion circuitry in the event of a first input sample and a subsequent second input sample with different signs illustrated in FIG. 1, or by using examples of digital to analog conversion circuitry. Some non-limiting examples of digital to analog conversion circuitry are subsequently described in FIGS. 4 to 6 and 8 to 10.

FIG. 4 illustrates an example for digital to analog conversion circuitry 400 using two DACs. A first DAC 402 is configured to dynamically switch between positive and negative LO (LO signal and inverted LO signal) is called core DAC. A second smaller DAC 404 is by contrast a split DAC, having two arrays of cells fixed to positive and negative sign respectively, which is they are operated with the LO signal and the inverted LO signal. The second DAC 404 for the sign changing events may, therefore, also be denoted an auxiliary DAC. The output of the system is the sum of the core DAC and the auxiliary DACs outputs. The concept may also be summarized as hybrid sign change. In the example of FIG. 4, the output of the digital to analog conversion circuitry 400 is provided to an antenna element 410 via a matching network 412, as it may be the case in many of the previously mentioned mobile telecommunication applications.

While, in the example of FIG. 4, the given number of cells of the digital to analog conversion circuitry is split between the first DAC 402 and the second DAC 404, further examples may use a single DAC or a single array of cells to implement the functionality, as illustrated in some of the further examples.

Figure 5:
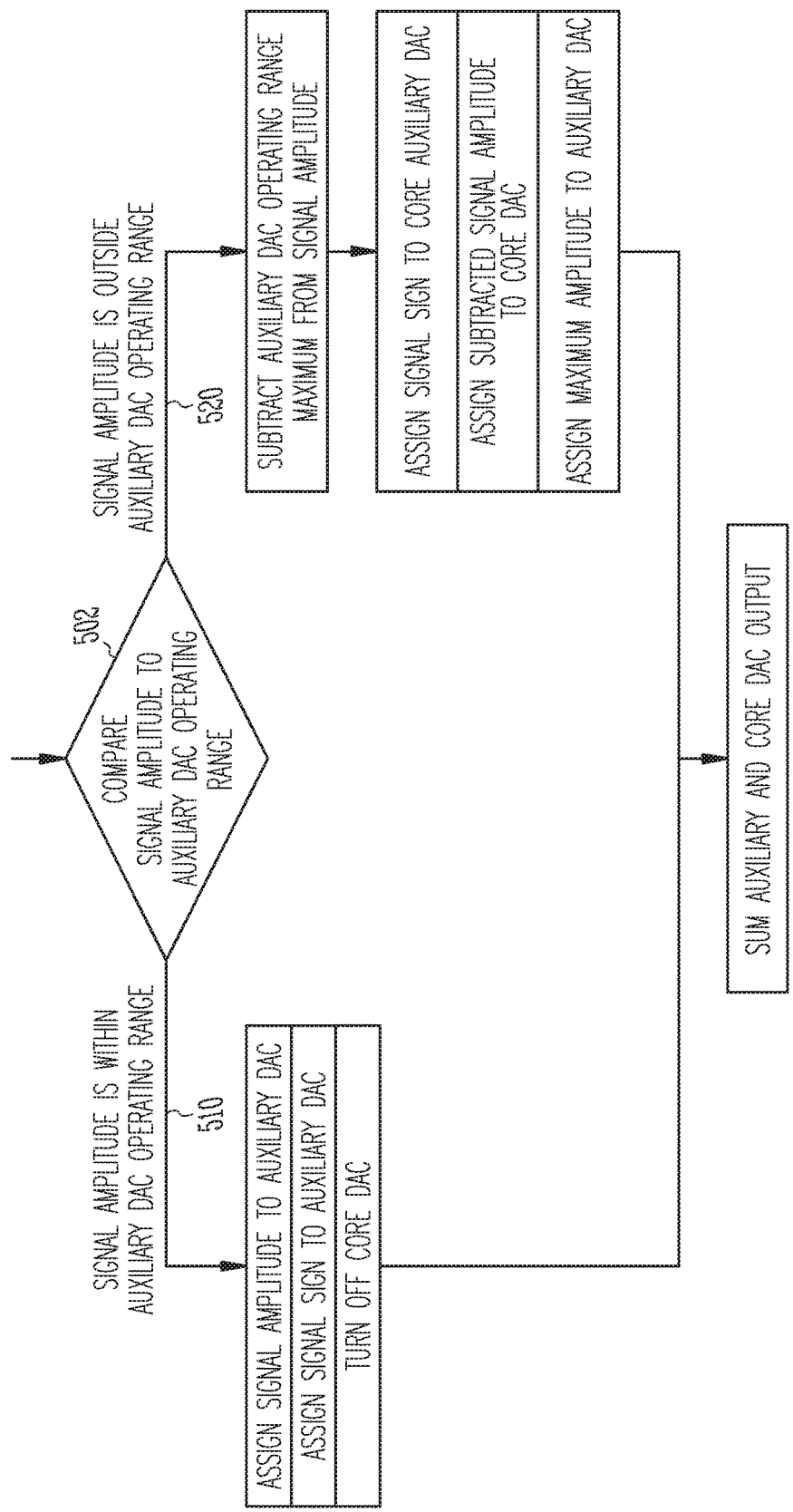
FIG. 5 illustrates a flowchart illustrating the operation of examples of digital to analog conversion circuitry.

FIG. 5 illustrates a flow chart explaining the operation of the example of FIG. 4 in greater detail. It is assumed that the auxiliary DAC 404 is sized so that it is ¼ of the size the core DAC 402 since the signal trajectories of the system provide for the assumption that the amplitudes of the subsequent samples around the sign change is smaller than ¼ of the maximum amplitude. The auxiliary DAC 404 turns on before the core DAC 402. When the signal exceeds the maximum amplitude managed by the auxiliary DAC 404, the core DAC 402 turns on and additionally contributes to the desired output signal. To this end, within the control logic 414 of the digital to analog conversion circuitry 400, the desired signal amplitude as indicated by the data signal 416 is compared with the maximum amplitude of the auxiliary DAC 404 in a comparing step 502. In the event that the desired signal amplitude is below the maximum amplitude of the auxiliary DAC 404, the signal amplitude is assigned to auxiliary DAC 404 and the core DAC 402 is turned off as illustrated by the first branch 510 of the flowchart in FIG. 5. If the dynamic range of the auxiliary DAC 404 is exceeded, the maximum amplitude for the auxiliary DAC 404 is subtracted from the desired signal amplitude and the remaining signal amplitude is assigned to the core DAC 402, as illustrated in the second branch 520 of the flowchart. In both events, the outputs of the auxiliary DAC 404 and the core DAC 402 are summed up to provide the output signal of the digital to analog conversion circuitry 400.

Since the signal during zero crossing is always small, all zero crossing transitions or sign changes take place while the core DAC is not active, and only after the transitions has occurred, the core DAC will turn on. Therefore, no sign transitions take place on the core DAC, because the core DAC will only have sign changing transitions from positive/ negative signal, then to zero, then to negative/positive signal again, which are not prone to timing errors once the core DAC is designed adequately.

Figure 6:
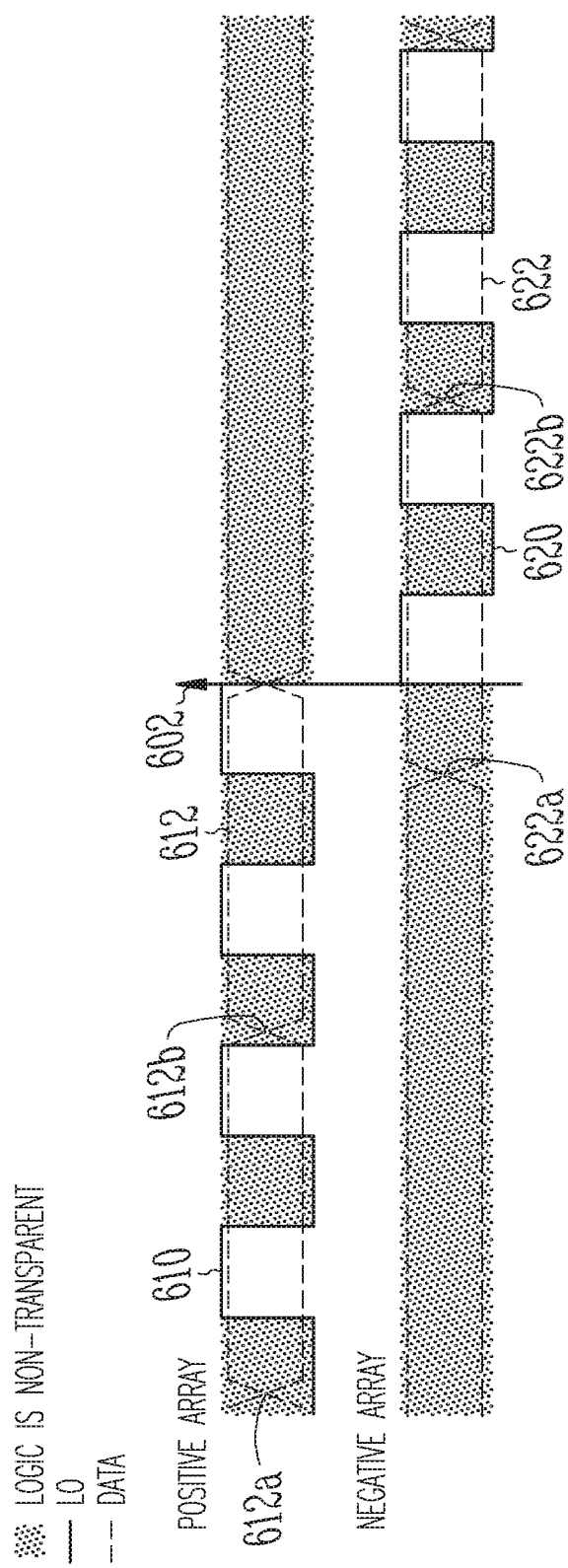
FIG. 6 illustrates the use of cells of a first subset of digital to analog conversion circuitry and the subsequent use of cells of a second subset.

FIG. 6 illustrates how the use of cells of a first subset being used with a LO signal 610 having a first polarity and the subsequent use of a second subset of cells with an inverted LO signal 620 (a second local oscillator signal having an inverted polarity) may provide a clean signal in the event of a sign change which is assumed to take place at time instant 602. In the illustration, the top signals show the signals of the first subset of cells while the bottom illustrations shows the signals of the second subset of cells using the inverted LO signal 620. The split implementation using the different subset of cells allows to always update the data signals 612 and 622 within the non-transparent periods of the cells as illustrated by means of time instants 612a, 612b, 622a and 622b. Consequently, the sign change can be implemented without introducing an error related to mismatch between the data signal and the corresponding LO Signal of the individual cells.

Figure 7:
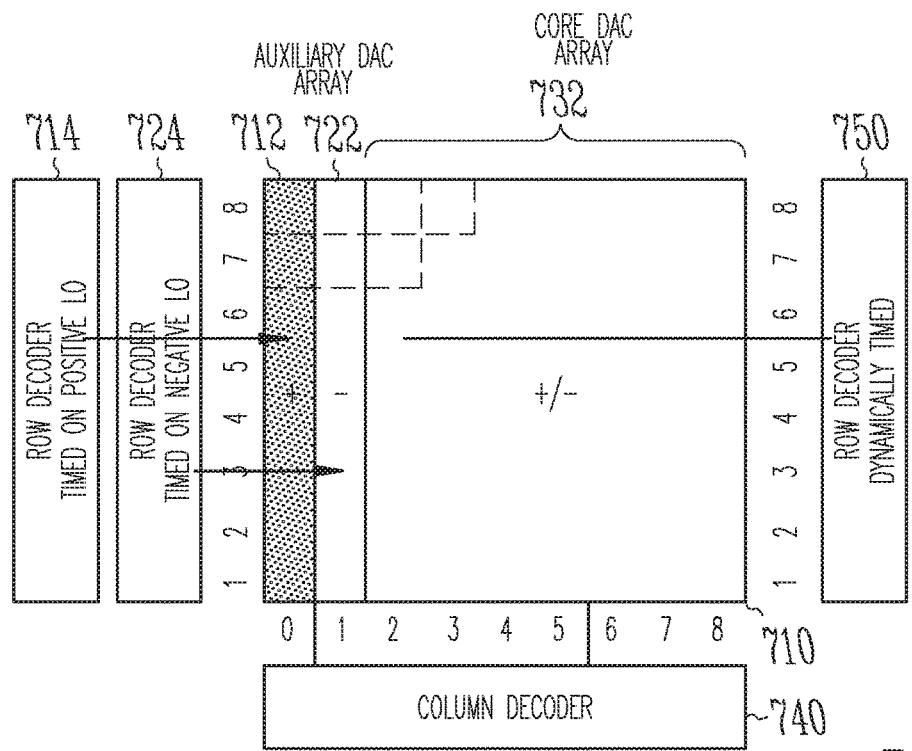
FIG. 7 illustrates an example of digital to analog conversion circuitry using a single array of cells.

In the example of FIG. 7, a single array of cells 710 is used to implement an example. These may be addressed similar to a conventional approach using thermometric arrays, i.e. using cells organized in columns and rows, using a column signal, a last signal and a row signal to address or select the cells to be used. The array of cells 710 performs both the functionality of an auxiliary DAC and core DAC. The first column of cells serves as a first subset of cells 712 configured to use a first local oscillator signal 714 (positive LO), while the second column serves as a second subset of cells 722 configured to use the second local oscillator signal 724 with inverted polarity (negative LO). The remaining cells serve a third subset of cells 732 configured to selectively use the first local oscillator signal 714 or the second local oscillator signal 724. Using the cells of a single array may avoid gain and offset deviations between the auxiliary DAC and the core DAC functionalities as well as differential non-linearity distortions when transiting between them as compared to approaches using separate arrays. Further, asymmetries such as unbalanced connections, local or global variations of process parameters may be avoided.

Figure 8:
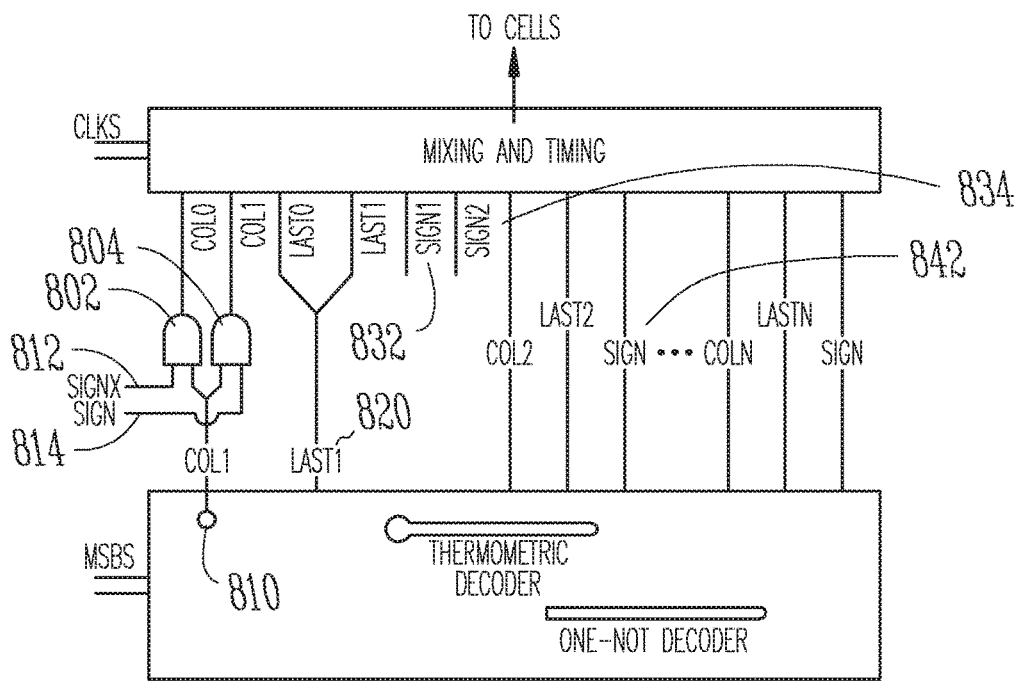
FIG. 8 illustrates an example of a column decoder which may be used for the array of cells in FIG. 7.

In a practical implementation, the active columns may be addressed by a COL signal generated by a Column decoder 740 also addressing the last column by a LAST signal. A ROW signal generated by a Row decoder 750 addresses the rows which are active in the LAST column. FIG. 8 illustrates an example of a column decoder to be used to address the cells 710 of the array. As far as the activation of the columns of the third subset of cells 732 providing the core DAC functionality are concerned, conventional column decoder logic may be used. The following description of FIG. 8, therefore, concentrates on the addenda to a conventional solution. The columns 712 and 722 of the first and second subsets (column 0 and column 1) are activated as follows, i.e. the associated local oscillator signals are applied according to the following criteria:

COL0 having the cells of the first subset 712 is activated only if the sign of the input sample is positive;
COL1 having the cells of the second subset 722 is activated only if the sign of the input sample is negative.

Both may be achieved by means of a first AND Gate 802 having an output providing a signal to activate the cells of the first column 712 and a second AND Gate 804 having an output providing a signal to activate the cells of the second column 722 if the inputs of AND gates 802, 804 are connected to permanent high level signal 810 on the one hand, and to a sign signal 812 indicating the sign of the input sample and an inverted sign signal 814 on the other hand, as illustrated in FIG. 8.

The LAST1 signal 820 is duplicated both on column 0 and on column 1, indicating whether those columns shall additionally use the ROW signal or not. A first sign signal 832 (SIGN1) of column 0 is fixed to positive while a second sign signal 834 (SIGN2) signal of column 1 is fixed to negative, indicating that the first and second subsets are always used with an LO signal of predetermined polarity. Therefore, columns 0 or 1 turn on depending on the sign of the signal, staying always on their fixed sign, respectively, positive and negative. To the contrary, the third sign signal 842 (SIGN) can be either positive or negative, indicating the polarity of the LO signal for the cells of the third subset 732.

Three row decoders may be used to determine the row signals for the three subsets of cells, the logic of the Row decoders being identical but differing in the way they are being timed. The row decoders operating the first subset 712 and the second subset 722 are timed on the negative edge of the LO signal and on the negative edge of the inverted LO signal, respectively. The row decoder for the third subset of cells 732 is dynamically timed between positive and negative LO signal edges according to the sign of the input signal.

It is further worth noting that in the event of a differential RF-DAC implementation, each subset of cells would have an identical number of cells working with the LO signal and with the inverted LO signal, respectively. However, a single row decoder would be sufficient for each of the first subset and the second subset to operate and address both the positive and negative cells. In particular, by twisting the connections of the row decoder data is timed on the opposite edge of the LO signal. Thus, with a twist, a single row decoder can provide data synched for the positive and for the negative cells of the auxiliary DAC. The extra logic required within a differential RF-DAC implementation would consequently be comparatively little.

Figure 9:
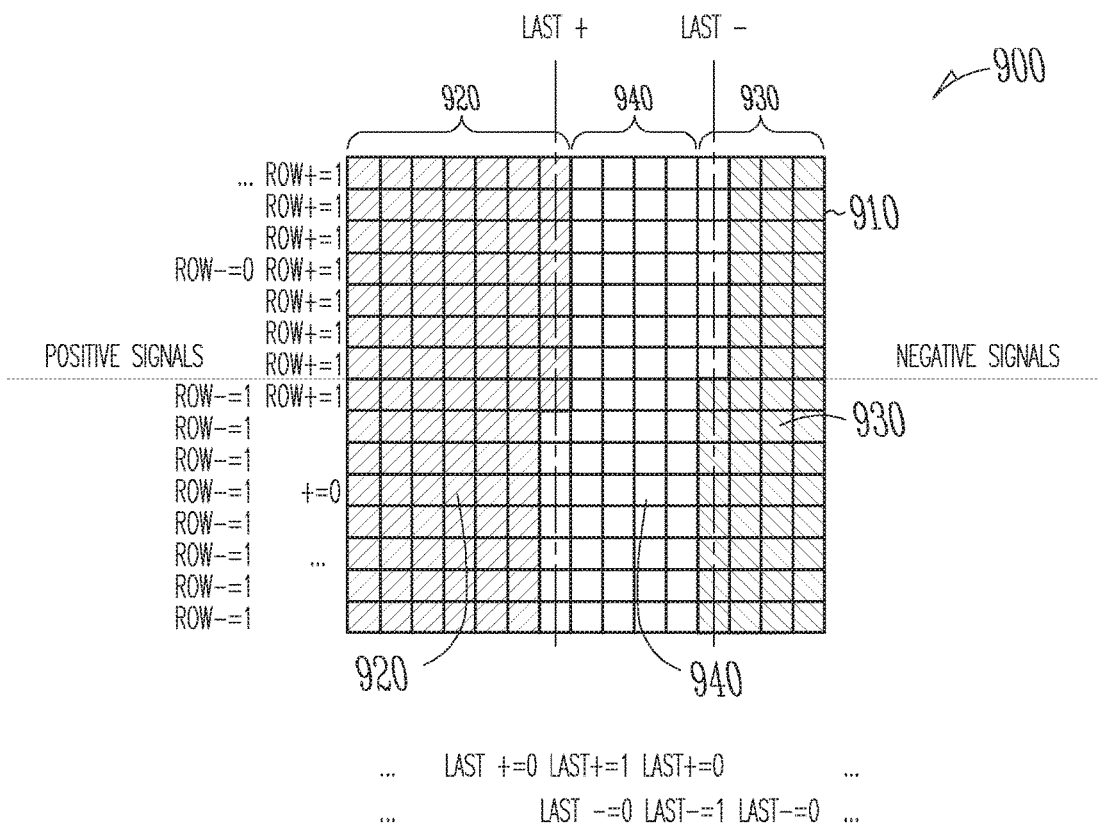
FIG. 9 illustrates a further example of digital to analog conversion circuitry using a single array of cells without permanently reserving cells for a sign change event.

FIG. 9 illustrates a further example of digital to analog conversion circuitry 900 using a single array of cells 910 without permanently reserving cells for the functionality of the sign change. Other than that, the cells of the first and second subsets are dynamically allocated. Hence, the second local oscillator signal with the inverse polarity is applied to the second subset of cells while the first local oscillator signal is already applied to other cells of the analog conversion circuitry.

The example of FIG. 9 (a "cell reusage"-implementation) again makes use of the fact that only a limited number of cells is commuting from positive to negative sign during a sign change transition. Therefore, a lot of cells of the array are inactive in this event, i.e. they are not producing any signal for, at least, a first input sample before the sign change and the subsequent input sample immediately after the sign change. Thus, with adequate control logic or with a method for operating the radio frequency digital to analog conversion circuitry comprising the cells, it is possible to use a subset of the inactive cells to provide the functionality required for a clean sign change, which was attributed to the auxiliary DAC in some of the previous examples.

One possible way to use the given number of cells of the array 910 and to dynamically allocate and select the cells of the second subset is to make use of cells or fill the array using two filling directions, one for each polarity of the LO signal. In the particular example of FIG. 9, the array is filled from left to right with positive-signed signals and from right to left with negative signed signals. During a positive to negative sign change, the leftmost part of the array empties until no more cells are used when the second input sample having a negative sign occurs. For the second input sample with negative sign, a selected number of cells of the second subset 930 of cells is used, which comprises the cells of the last column of the array. Likewise, the first subset of cells 920 used with the local oscillator signal having the first polarity for the first input sample before the sign change comprises the cells of the first column. During the sign change, the cells of the first subset 920 have a positive to zero transition, that is, the LO signal having positive polarity is no longer applied to the cells of the first subset after the sign change. Further, the LO signal having the negative polarity is applied to the cells of the second subset while the LO signal is already applied to other cells (e.g. within the first suset) of the digital to analog conversion circuitry, enabling to select the appropriate number of cells within the second subset 930 by means of the data in the non transparent half cycle of the negative LO signal that precedes the sign change, so enabling a clean transition between opposing polarities.

Similarly, during a negative to positive sign change transition, the rightmost part of the array 910 empties and the leftmost starts to fill up. This means that the rightmost part of the array has a positive to zero transition, which is clean, and the leftmost part of the array has a zero to negative transition, which is also clean. Thus both positive-to-negative and negativeto-positive sign transitions are guaranteed to produce a clean signal.

Figure 10:
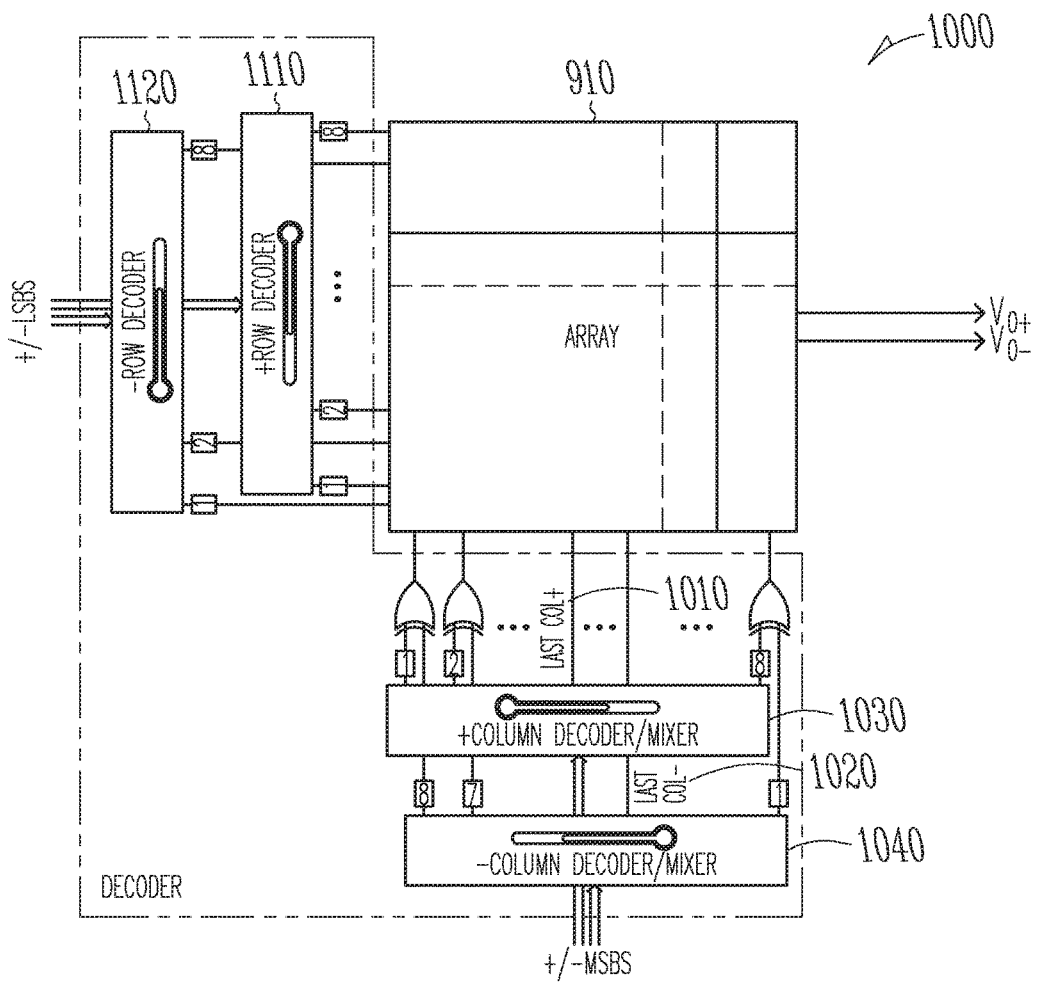
FIG. 10 illustrates an example of a controller which may be used for the array of cells in FIG. 9.

FIG. 10 schematically illustrates an example of a controller 1000 to provide appropriate column and row signals to implement the previously described functionality for an array of cells 910 as illustrated in FIG. 9. To this end, additional commands may be required. The command LAST+ 1010 and the command LAST− 1020, indicating which column of the thermometric coded array is the last one and therefore sensitive to the ROW signals, is further generated. Further, the commands ROW+ and ROW− are generated, indicating which cells within the columns identified by the LAST+ and LAST− commands are selected. The LAST+ and the ROW+ signals are generated by a positive timed decoder, and the LAST− and the ROW− signals are generated by a negative timed decoder to provide the correct relative timing between the data and the LO signals of the different polarities, respectively. A common COL signal, which is indicating the columns having all cells used with one of the LO signals is dynamically timed between positive and negative clocks, depending on the Polarity used. However, due to the operation mode of the array, the cells of the columns selected by means of the COL signals only have a transition from positive/negative to zero or from zero to negative/positive, thus never giving rise to misalignment between data and the LO signal in the event of a sign change.

An example on how to appropriately generate the LAST+, LAST−, ROW+, ROW− and COL signals is shown in FIG. 10. Like in the example of FIG. 7, only differences with respect to conventional approaches are shortly discussed. One may use two binary to thermometric converters 1030 and 1040 to generate the COL and LAST+/LAST− signals if the thermometric converters 1030 and 1040 are horizontally mirrored, so that they fill up in opposite directions. Further, two binary to thermometric converters 1110 and 1120 may be used to generate the ROW signals, which may have the same filling directions. It is important to notice, that the input signals of the positive and negative thermometric converters don't correspond the original data signals (datainput) indicating the desired amplitude. Instead, the positive thermometric converters 1030 and 1110 (providing ROW+ and LAST+) are provided with:

datainput if datainput >=0
0 if datainput <0.

Likewise, the negative thermometric converters 1040 and 1120 (providing ROW− and LAST−) are provided with:

datainput if datainput <=0
0 if datainput >0.

As illustrated in FIG. 10, the final COL signal for the array 910 is generated multiplexing the two COL signals generated by the positive and the negative thermometric converters 1030 and 1040 (+ COLUMN DECODER and − COLUMN DECODER), i.e. by masking the signal produced by the two decoders using OR or XOR An advantage of the examples illustrated in FIGS. 9 and 10 is that no extra cells are added to the array, so array size and efficiency are unchanged only at the requirement to route slightly more signals to the array 910. In other words, FIGS. 9 and 10 illustrate the feasibility of a clean sign transitions according to the examples described herein also within the cell-re-usage concept. The application of the concept within the cell-re-usage concept is of course not limited to this particular implementation, but covers in general the idea in which the array is dynamically signed between positive and negative signs using different portions of the array for producing the positive and negative part of the signal.

Figure 11:
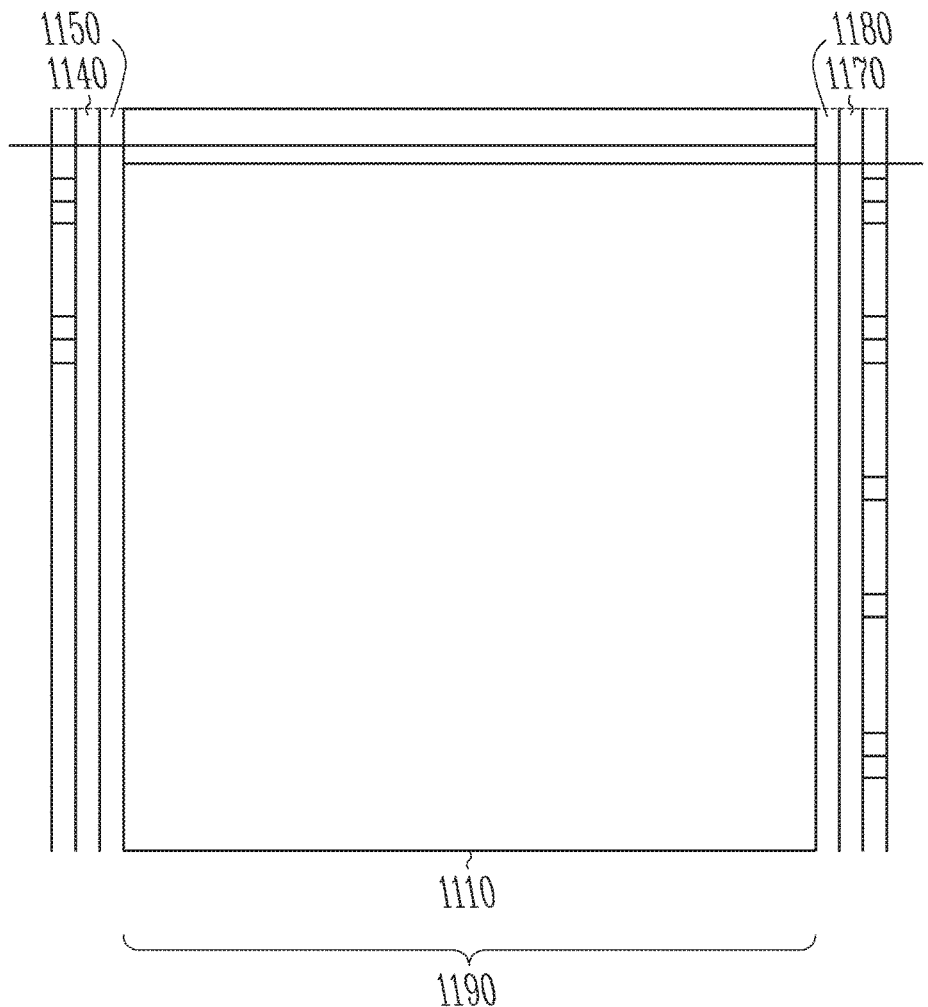
FIG. 11 illustrates an example of digital to analog conversion circuitry using a single array for I as well as Q components.

FIG. 11 schematically illustrates the application of the concept described herein into digital to analog conversion circuitry using a single array of cells to provide analog conversion of the I component as well as for the Q component of a transmit signal. In a combined I/Q DAC, the given number of cells is shared between the I component and the Q component. During operation, the carrier signals of the I component and the Q component (being 90° phase shifted with respect to each other) can be selectably applied to the cells so that for one sample, a particular cell may be used for the generation of the I component, while for another sample, the same cell may be used for the generation of the Q component. In one implementation, the dynamic I/Q array is filled dynamically with I-phased cells from the left side to the right side of the array, and with Q-phased cells from the right side to the left side of the array.

In order to also provide for the capability of clean sign changes, two auxiliary DACs may, for example, be added on the left and on the right side of the array 1110. That is, for example, a first subset 1140 of the given number of cells of the array 1110 is reserved for the positive LO signal of the sign change functionality of the I component, while a second subset 1150 is reserved for the negative LO signal for the sign change functionality of the I component. Likewise, a third subset 1170 of the given number of cells of the array 1110 is reserved for the positive LO signal of the sign change functionality of the Q component, while a fourth subset 1180 is reserved for the negative LO signal for the sign change functionality of the Q component. The remaining cells of the array 1110 contribute to a fifth subset 1190 in which the cells are dynamically allocated for the generation of either the I component or the Q component for both polarities.

Also in the example of the hybrid sign change in a dynamic I/Q array as illustrated in FIG. 11, a local and global-process variation free layout can be achieved. The auxiliary and the core DAC functionality is merged into one single array 1110 with columns and rows working with different control signals, but keeping an array of equal cells throughout the area of the array, thus improving linearity, DNL and INL of the DAC. While the subsets of cells 1140, 1150, 1170 and 1180 used to implement the functionality of an auxiliary DAC in FIG. 11 are each equivalent to a single column of the array, further examples may of course also use a different partitioning of the cells of the array, for example resulting in subsets being 2, 3, or an arbitrary number of columns wide.

Figure 12:
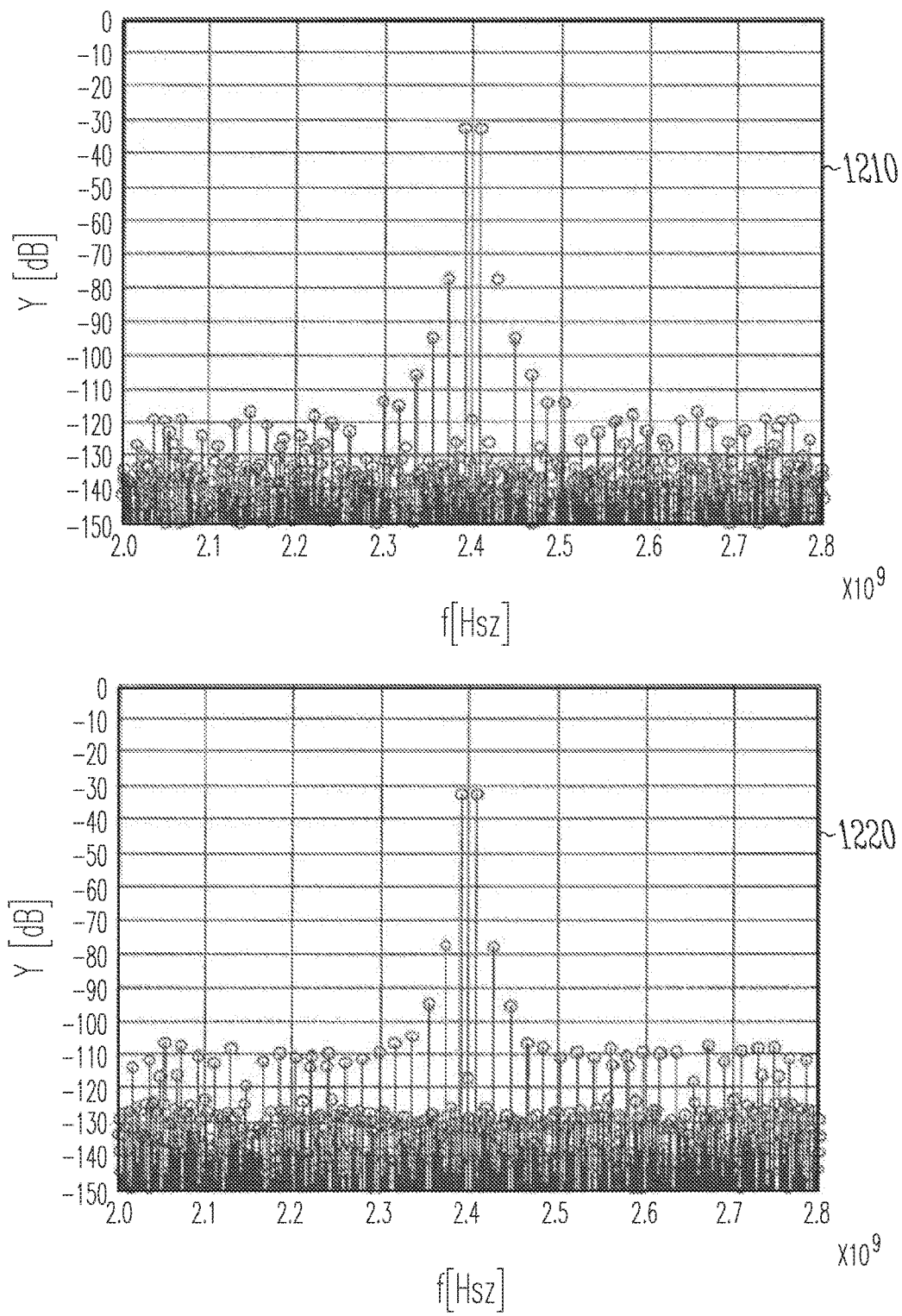
FIG. 12 illustrates a comparison of signal spectra generated using a conventional DAC and an example as described herein.

FIG. 12 illustrates a comparison between the spectrum of a signal generated by a conventional DAC and by an identical array of cells operated according to an example of a method as described herein. The upper graph 1210 illustrates the spectrum of the generated signal using an example as described herein. The spectrum is centered at a carrier frequency of 2.4 GHz and exhibits far off noise contributions up to minus 120 dB, which is more than 10 dB better than the noise level of the lower graph 1220, showing the spectrum of a conventional DAC. This impressively illustrates how the noise may be reduced by operating an identical array of DAC cells according the examples of the methods proposed herein.

Figure 13:
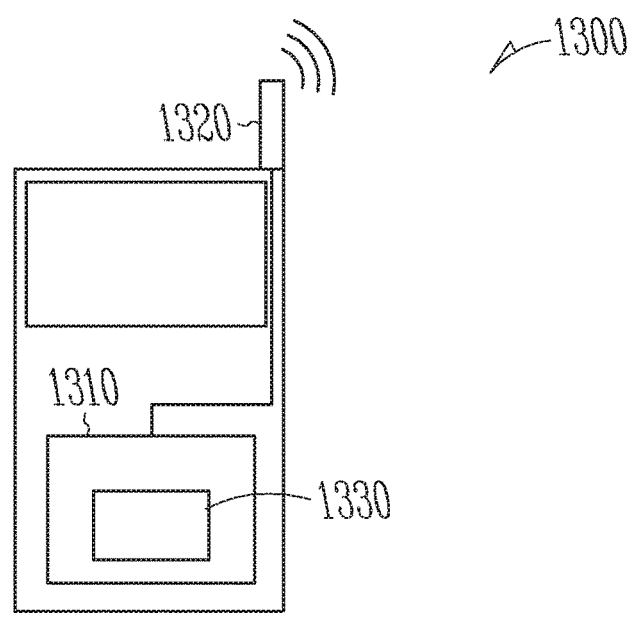
FIG. 13 schematically illustrates a mobile telecommunications device.

FIG. 13 schematically illustrates a mobile telecommunications device 1300 having a transmitter 1310 comprising digital to analog conversion circuitry 1330 according to an example described herein. The transmitter is coupled to an antenna 1320 of the telecommunications device 1300 to be able to radiate an RF Signal generated using the digital to analog conversion circuitry 1330 into the environment.

Figure 14:
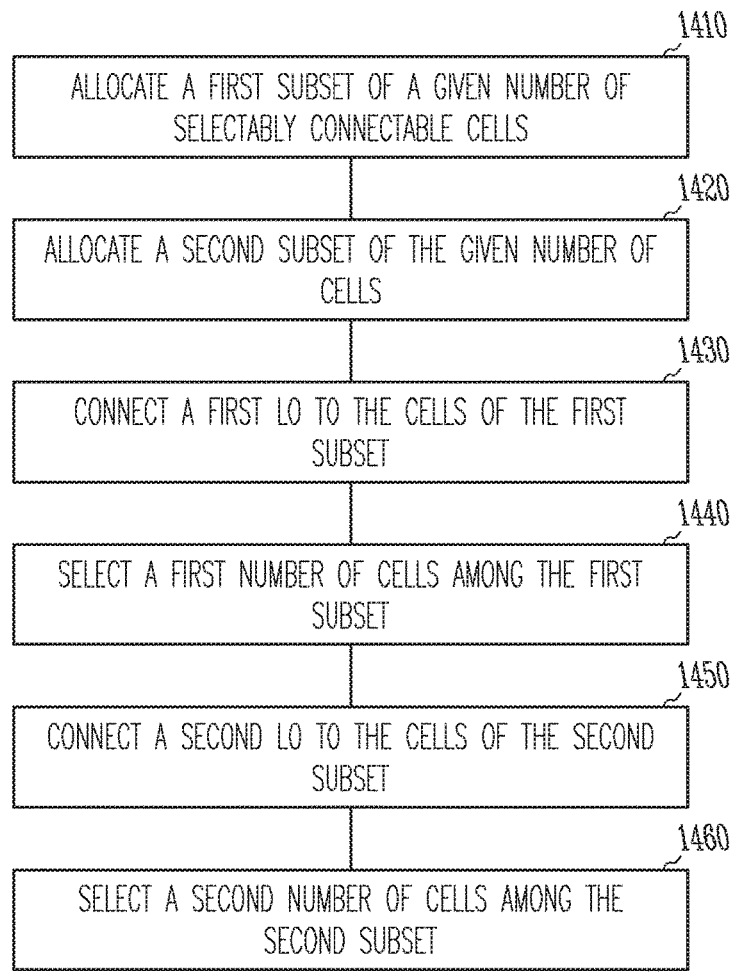
FIG. 14 illustrates an example a flowchart of a further example of a method for operating radio frequency digital to analog conversion circuitry with a given number of cells being selectably connectable to a first local oscillator signal or to a second local oscillator signal.

FIG. 14 illustrates a flowchart of an example of method for operating radio frequency digital to analog conversion circuitry in the event of a first input sample and a subsequent second input sample with different signs.

The method comprises allocating 1410 a first subset of a given number of cells of the digital to analog conversion circuitry, each cell of the given number being selectably connectable to a first local oscillator signal or to a second local oscillator signal.

The method further comprises allocating 1420 a second subset of the given number of cells.

Further, the method comprises, connecting 1430 the first local oscillator signal to the cells of the first subset; and selecting 1440 a first number of cells among the first subset to generate a first analog signal corresponding to the first input sample.

The method further comprises connecting 1450 the second local oscillator signal to the cells of the second subset of cells such that it is connected while the number of cells of the among the first subset are selected; and selecting 1460 a second number of cells among the second subset to generate a second analog signal corresponding to the second input sample.

Using an example of the previously summarized method together with a digital to analog conversion circuitry, having cells being selectably connectable to a first local oscillator signal or to a second local oscillator signal, allows to implement clean sign changes without requiring additional cells and, at the same time, maintaining the full dynamic range of the digital to analog conversion circuitry.

Example 1 is a method for operating radio frequency digital to analog conversion circuitry with a number of cells if a first input sample and a subsequent second input sample have different signs, the method comprising generating a first analog signal corresponding to the first input sample using a first subset of the number of cells of the digital to analog conversion circuitry with a local oscillator signal having a first polarity, applying a second local oscillator signal with an inverted polarity to a second subset of cells of the digital to analog conversion circuitry when a number of cells from the first subset of cells are used; and selecting a number of cells from the second subset of cells to generate a second analog signal corresponding to the second input sample.

In Example 2, the method of example 1 optionally further comprises releasing the first subset of cells from the local oscillator signal to extend the second subset of cells to the cells of the released first subset if needed for a further input sample.

In Example 3, the method of examples 1 or 2, optionally further comprises selecting the second subset of cells within a cycle of the second local oscillator signal which is non-transparent to selection related to the second local oscillator signal.

In Example 4, the method of any of the previous examples optionally further comprises applying the second local oscillator signal within a cycle of the first oscillator signal.

In Example 5, the method of any of the preceding examples optionally further comprises arranging the number of cells of the digital to analog conversion circuitry in an array of columns and rows, wherein the second subset of cells comprises cells of the last column of the array, if the first subset comprises cells of the first column and vice versa.

In Example 6, in the method of any of the preceding examples, applying the second local oscillator signal comprises switching an input of the cells of the second subset from ground to the second oscillator signal.

In Example 7, the method of any of the preceding examples optionally further comprises applying the second local oscillator signal to the second subset of cells while the local oscillator signal is already applied to cells of the digital to analog conversion circuitry.

Example 8 is a method for operating radio frequency digital to analog conversion circuitry if a first input sample and a subsequent second input sample have different signs, the method comprising allocating a first subset of cells of the digital to analog conversion circuitry, each cell being selectably connectable to a first local oscillator signal or to a second local oscillator signal; allocating a second subset of cells; connecting the first local oscillator signal to the first subset; selecting a first number of cells from the first subset to generate a first analog signal corresponding to the first input sample; connecting the second local oscillator signal to the second subset of cells such that the connection is established while the first number of cells of the from the first subset are selected; and selecting a second number of cells from the second subset to generate a second analog signal corresponding to the second input sample.

In Example 9, in the method of example 8, the first local oscillator signal and the second local oscillator signal have the same frequency and a phase shift of 180 degrees.

In Example 10, in the method of examples 8 or 9, releasing the first subset of cells comprises disconnecting the first local oscillator signal from the cells of the first subset.

Example 11 is a radio frequency digital to analog conversion circuitry having a given number of cells, comprising a first subset of cells configured to use a first local oscillator signal; a second subset of cells configured to use a second local oscillator signal; and a third subset of cells configured to selectively use the first local oscillator signal or the second local oscillator signal.

In Example 12, in the radio frequency digital to analog conversion circuitry of example 11, the number of cells in the first subset and the number of cells in the second subset is equal.

In Example 13, in the radio frequency digital to analog conversion circuitry of example 11 or 12, the number of cells in the third subset is bigger than the number of cells in first subset and in the second subset.

In Example 14, the radio frequency digital to analog conversion circuitry of examples 11 to 13, the number of cells within the first subset is less than 25% of the given number of cells.

In Example 15, in the radio frequency digital to analog conversion circuitry of any of examples 11 to 14, the first local oscillator signal and the second local oscillator signal have the same frequency and a phase shift of 180 degrees.

In Example 16, in the radio frequency digital to analog conversion circuitry of any of examples 11 to 15, the cells of the third subset of cells comprise an input configured to be switched from ground to the second or from ground to the first oscillator signal.

Example 17 is a transmitter comprising radio frequency digital to analog conversion circuitry according to any of examples 11 to 16.

In Example 18, the transmitter of example 17 optionally further comprises an oscillation circuit configured to generate at least the first local oscillator signal.

Example 19 is a mobile communications device comprising a transmitter according to any of examples 17 or 18.

In Example 20, the mobile communications device of example 19 optionally further comprises at least one antenna coupled to the transmitter.

Example 21 is a control circuit for operating a radio frequency digital to analog conversion circuitry with number of cells if a first input sample and a subsequent second input sample have different signs, comprising control means configured to generate a first analog signal corresponding to the first input sample using a first subset of the number of cells of the digital to analog conversion circuitry with a local oscillator signal having a first polarity; application means configured to apply a second local oscillator signal with an inverted polarity to a second subset of cells of the digital to analog conversion circuitry when a number of cells of the among the first subset are used; and selection means configured to select a number of cells from the second subset of cells to generate a second analog signal corresponding to the second input sample.

In example 22, the control circuit of example 21 optionally further comprises releasing means configured to release the first subset of the number of cells from the local oscillator signal, to extend the second subset of cells to the cells of the released first subset if needed for a further input sample.

In example 23, in the control circuit of example 21 or 22, the application means is configured to apply the second local oscillator signal within a cycle of the first oscillator signal.

Example 24 is a control circuit for operating radio frequency digital to analog conversion circuitry if a first input sample and a subsequent second input sample have different signs, the method comprising first allocation means configured to allocate a first subset of cells of the digital to analog conversion circuitry, each cell being selectably connectable to a first local oscillator signal or to a second local oscillator signal; second allocation means configured to allocate a second subset of cells; first connection means configured to connect the first local oscillator signal to the first subset; first selection means configured to select a first number of cells from the first subset to generate a first analog signal corresponding to the first input sample; second connection means configured to connect the second local oscillator signal to the second subset of cells such that the connection is established while the number of cells of the among the first subset are selected; and second selection means configured to select a second number of cells from the second subset to generate a second analog signal corresponding to the second input sample.

In example 25, the control circuit for operating radio frequency digital to analog conversion circuitry of example 24 optionally further comprises releasing means configured to disconnect the first local oscillator signal from the cells of the first subset.

Example 26 is a controller for operating radio frequency digital to analog conversion circuitry with a number of cells if a first input sample and a subsequent second input sample have different signs, the controller comprising a column controller configured to apply a local oscillator signal having a first polarity to a first subset of the number of cells to generate a first analog signal corresponding to the first input sample; the column controller being further configured to apply a second local oscillator signal with an inverted polarity to a second subset of cells when a number of cells from the first subset is used; a row controller configured to select a number of cells from the second subset of cells to generate a second analog signal corresponding to the second input sample.

In example 27, the column controller of example 26 is further configured to releasing the first subset cells from to extend the second subset of cells to the cells of the released first subset if needed for a further input sample.

In example 28, the column controller of example 26 or 27 is configured to apply the second local oscillator signal within a cycle of the first oscillator signal.

In example 29, in the controller of any of examples 26 to 28, the column controller is configured to apply the second local oscillator signal to the second subset of cells while the local oscillator signal is already applied to cells of the digital to analog conversion circuitry.

In example 30, in the controller of any of examples 26 to 29, the column controller is configured to switch an input of the cells of the second subset from ground to the second oscillator signal to apply the second local oscillator signal.

Example 31 is a computer readable storage medium having stored thereon a program having a program code for performing the method of any of examples 1 to 10, when the program is executed on a computer or processor.

Example 32 is a computer program having a program code configured to perform the method of any of examples 1 to 10, when the computer program is executed on a computer or processor.

The aspects and features mentioned and described together with one or more of the previously detailed examples and figures, may as well be combined with one or more of the other examples in order to replace a like feature of the other example or in order to additionally introduce the feature to the other example.

Examples may further be a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A functional block denoted as "means for . . ." performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A method for operating radio frequency digital to analog conversion circuitry with a number of cells if a first input sample and a subsequent second input sample have different signs, the method comprising:
    generating a first analog signal corresponding to the first input sample using a first subset of the number of cells of the digital to analog conversion circuitry with a local oscillator signal having a first polarity;
    applying a second local oscillator signal with an inverted polarity to a second subset of cells of the digital to analog conversion circuitry when a number of cells from the first subset of cells are used;
    selecting a number of cells from the second subset of cells to generate a second analog signal corresponding to the second input sample.

2. The method of claim 1, further comprising:
    releasing the first subset of cells from the local oscillator signal to extend the second subset of cells to the cells of the released first subset if needed for a further input sample.

3. The method of claim 1, further comprising selecting the second subset of cells within a cycle of the second local oscillator signal which is non-transparent to selection related to the second local oscillator signal.

4. The method of claim 1, further comprising applying the second local oscillator signal within a cycle of the first oscillator signal.

5. The method of claim 1, further comprising arranging the number of cells of the digital to analog conversion circuitry in an array of columns and rows, wherein the second subset of cells comprises cells of the last column of the array, if the first subset comprises cells of the first column and vice versa.

6. The method of claim 1, wherein applying the second local oscillator signal comprises switching an input of the cells of the second subset from ground to the second oscillator signal.

7. The method of claim 1, wherein applying the second local oscillator signal to the second subset of cells while the local oscillator signal is already applied to cells of the digital to analog conversion circuitry.

8. A method for operating radio frequency digital to analog conversion circuitry if a first input sample and a subsequent second input sample have different signs, the method comprising:

allocating a first subset of cells of the digital to analog conversion circuitry, each cell being selectably connectable to a first local oscillator signal or to a second local oscillator signal;

allocating a second subset of cells;

connecting the first local oscillator signal to the first subset;

selecting a first number of cells from the first subset to generate a first analog signal corresponding to the first input sample;

connecting the second local oscillator signal to the second subset of cells such that the connection is established while the first number of cells from the first subset are selected; and selecting a second number of cells from the second subset to generate a second analog signal corresponding to the second input sample.

9. The method of claim 8, wherein the first local oscillator signal and the second local oscillator signal have the same frequency and a phase shift of 180 degrees.

10. The method of claim 8, further comprising:

releasing the first subset of cells disconnecting the first local oscillator signal from the cells of the first subset.

11. A radio frequency digital to analog conversion circuitry having a given number of cells, comprising:

a first subset of cells configured to use a first local oscillator signal;

a second subset of cells configured to use a second local oscillator signal; and a third subset of cells configured to selectively use the first local oscillator signal or the second local oscillator signal.

12. The radio frequency digital to analog conversion circuitry of claim 11, wherein the number of cells in the first subset and the number of cells in the second subset is equal.

13. The radio frequency digital to analog conversion circuitry of claim 11, wherein the number of cells in the third subset is bigger than the number of cells in first subset and in the second subset.

14. The radio frequency digital to analog conversion circuitry of claim 11, wherein the number of cells within the first subset is less than 25% of the given number of cells.

15. A controller for operating radio frequency digital to analog conversion circuitry with a number of cells if a first input sample and a subsequent second input sample have different signs, the controller comprising:

a column controller configured to apply a local oscillator signal having a first polarity to a first subset of the number of cells to generate a first analog signal corresponding to the first input sample;

the column controller being further configured to apply a second local oscillator signal with an inverted polarity to a second subset of cells when a number of cells from the first subset is used;

a row controller configured to select a number of cells from the second subset of cells to generate a second analog signal corresponding to the second input sample.

16. The controller of claim 15, wherein the column controller is further configured to release the first subset of cells to extend the second subset of cells to the cells of the released first subset if needed for a further input sample.

17. The controller of claim 15, wherein the column controller is configured to apply the second local oscillator signal within a cycle of the first oscillator signal.

18. The controller of claim 15, wherein the column controller is configured to apply the second local oscillator signal to the second subset of cells while the local oscillator signal is already applied to cells of the digital to analog conversion circuitry.

19. The controller of claim 15, wherein the column controller is configured to switch an input of the cells of the second subset from ground to the second oscillator signal to apply the second local oscillator signal.

* * * * *

UNITED STATES PATENT AND TRADEMARK OFFICE
CERTIFICATE OF CORRECTION

PATENT NO.         : 9,647,678 B2
APPLICATION NO.    : 15/240462
DATED              : May 9, 2017
INVENTOR(S)        : Passamani et al.

It is certified that error appears in the above-identified patent and that said Letters Patent is hereby corrected as shown below:

On the Title Page

Item (30), in "Foreign Application Priority Data", in Column 1, Line 1, delete "10 2015 116 241" and insert --10 2015 116 241.5-- therefor Signed and Sealed this
Fourth Day of June, 2019

Andrei Iancu
*Director of the United States Patent and Trademark Office*